United States Patent
Rafeeque

(10) Patent No.: US 8,004,366 B2
(45) Date of Patent: Aug. 23, 2011

(54) AREA AND POWER EFFICIENT, HIGH SWING AND MONOLITIHIC GROUND CENTERED HEADPHONE AMPLIFIER CIRCUIT OPERABLE ON A LOW VOLTAGE

(75) Inventor: Sunil Rafeeque, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 12/608,176

(22) Filed: Oct. 29, 2009

(65) Prior Publication Data
US 2011/0102082 A1    May 5, 2011

(51) Int. Cl.
*H03F 3/04* (2006.01)
(52) U.S. Cl. ..................... 330/297; 330/310
(58) Field of Classification Search ............ 330/297, 330/310; 327/148, 157
See application file for complete search history.

(56) References Cited

U.S. PATENT DOCUMENTS 7,619,479 B2 * 11/2009 Azuhata et al. ............... 330/297
7,808,324 B1 * 10/2010 Woodford et al. ............ 330/297
* cited by examiner

*Primary Examiner* — Khanh V Nguyen
(74) *Attorney, Agent, or Firm* — John J. Patti; Wade J. Brady, III; Frederick J. Telecky, Jr.

(57) ABSTRACT

A minimal area, power efficient, high swing and monolithic ground centered headphone amplifier circuit operable on a low voltage. An input amplifier stage includes a first input terminal and a second input terminal and having a first gain. An output amplifier stage is coupled to an output of the input amplifier stage to provide an output signal and having a second gain. A feedback network coupled between the first input terminal and the output of the output amplifier stage. A level shifting unit coupled to the first input terminal and the feedback network. A charge pump coupled to the output amplifier stage to generate a negative supply voltage and to minimize a noise associated with the negative supply voltage using a loop gain of the amplifier, wherein the loop gain is a combination of the first gain, the second gain, and a gain of the feedback network.

18 Claims, 5 Drawing Sheets

AREA AND POWER EFFICIENT, HIGH SWING AND MONOLITIHIC GROUND CENTERED HEADPHONE AMPLIFIER CIRCUIT OPERABLE ON A LOW VOLTAGE

TECHNICAL FIELD

Embodiments of the disclosure relate to a minimal area, power efficient, high swing and monolithic ground centered amplifier circuit operable on a low voltage.

BACKGROUND

In some applications, especially in battery-powered portable devices, the only available power supply has a maximum voltage lesser than the desired peak-to-peak voltage swing of an output signal. One solution to this problem has been to use a DC-to-DC converter to boost the power supply voltage applied to the output stage of a multi-stage amplifier. However, DC-to-DC converters introduce undesirable noise to the device. Components that can eliminate such noise, and other components needed to regulate the output of such converters, require significant amount of surface area in integrated circuits and can waste power.

Typically, power obtained at an output of a headphone amplifier drives a load and is in the range of few tens of milli watts. The headphone amplifier is typically coupled between a core of a portable electronic device and the headphone. The core operates with a supply having a reference voltage different from another reference voltage of the headphone amplifier. Hence, a capacitor is used to couple the core with the headphone amplifier leading to a larger chip area and a bulkier amplifier device. Further, the capacitor modifies frequency response by reducing pass band of the headphone amplifier. The pass band reduces with the value of the capacitor causing a loss in bass in the headphone amplifier.

Conventional amplifiers use a dual voltage supply for its power supply requirements and hence an external circuit is required for generating a power rail that is negative with respect to the ground. In addition to the power rail, the external circuitry also provides noise in the form of undesired ripples. The conventional headphone amplifier requires a large Power Supply Rejection Ratio (PSRR) in order to filter the undesired ripples at the output of the conventional headphone amplifier. Further, the conventional headphone amplifier uses a Low-dropout (LDO) regulator which results in a larger consumption of area. Also, the LDO regulator contributes for a loss of power causing a rise in the total power dissipation of the conventional headphone amplifier. An offset in a conventional headphone amplifier circuit directly adds up to the quiescent current. In light of the foregoing discussion, an amplifier circuit which overcomes one or more of the above mentioned limitations is needed.

SUMMARY

An example of an amplifier embodying the invention includes an input amplifier stage having a first input terminal and a second input terminal and having a first gain. The first input terminal receives an input signal and the second input terminal receives a constant DC voltage. The input amplifier stage is operable from a power supply that develops a first potential between a first active supply terminal and a neutral terminal. The amplifier includes an output amplifier stage coupled to an output of the input amplifier stage and having a second gain. The output amplifier stage is operable from a power supply that develops a second potential between the first active supply terminal and a second active supply terminal and to provide an output signal. The amplifier includes a feedback network coupled between the first input terminal and an output of the output amplifier stage. The amplifier includes a level shifting unit coupled to the first input terminal and the feedback network. The level shifting unit is responsive to a difference in magnitude between an external sense pin and the second input terminal to generate a level shifting current that enables the output amplifier stage to bring down a DC value in the output signal. The amplifier also includes a charge pump coupled to the output amplifier stage. The charge pump is operational to generate a negative supply voltage provided to the output amplifier stage and to minimize a noise associated with the negative supply voltage using a loop gain of the amplifier, wherein the loop gain is a combination of the first gain, the second gain, and a gain of the feedback network.

An example of a method for amplifying a signal in a multistage amplifier includes receiving an input signal and a constant DC voltage at an input stage of the multi-stage amplifier. The method includes amplifying the input signal to provide an amplified output signal at an output stage of the multi-stage amplifier. The method includes generating a level shifting current to enable the output stage to bring down a DC value in the amplified output signal. The method includes providing a negative voltage to the output amplifier stage using a charge pump.

An example of an amplification system includes an input amplifier stage having a first input terminal and a second input terminal and having a first gain. The first input terminal receives an input signal, the second input terminal receives a constant DC voltage. The input amplifier stage is operable from a power supply that develops a first potential between a first active supply terminal and a neutral terminal. The amplification system includes an output amplifier stage coupled to an output of the input amplifier stage and having a second gain. The output amplifier stage is operable from a power supply that develops a second potential between the first active supply terminal and a second active supply terminal and to provide an output signal. The amplification system includes a feedback network coupled between the first input terminal and an output of the output amplifier stage. The amplification system also includes a level shifting unit coupled to the first input terminal and the feedback network. The level shifting unit is responsive to a difference in magnitude between an external sense pin and the second input terminal to generate a level shifting current that enables the output amplifier stage to bring down a DC value in the output signal. The amplification system further includes a charge pump coupled to the output amplifier stage. The charge pump is operational to generate a negative supply voltage provided to the output amplifier stage and to minimize a noise associated with the negative supply voltage using a loop gain of the amplifier. The loop gain is a combination of the first gain, the second gain, and a gain of the feedback network. The amplification system includes a discharge unit coupled to the charge pump and operational to minimize voltage across the output amplifier stage when signal swing saturation occurs at supply voltages greater than reliability limit responsive to an operation of the charge pump. The amplification system also includes an offset correction circuit coupled to the output amplifier stage. The offset correction circuit comprising a buffer coupled to a digital module that generates a digital code corresponding to an offset and to correct the offset in the output signal.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the disclosure.

DETAILED DESCRIPTION OF THE EMBODIMENTS

Figure 1:
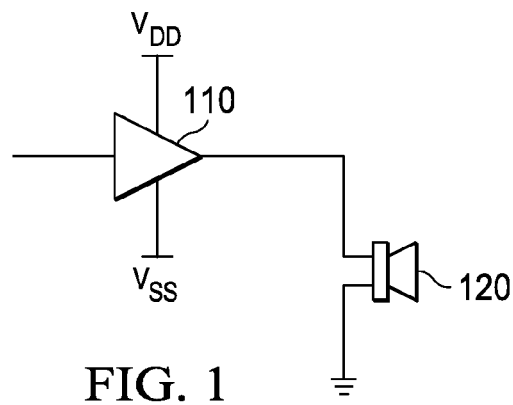
FIG. 1 is a schematic diagram of an amplifier, in accordance with one embodiment.

FIG. 1 illustrates a schematic diagram of an amplifier. The amplifier can be, for example low voltage, low power, low area, high swing amplifier. The amplifier includes a multi-stage amplifier 110. The multi-stage amplifier 110 includes an input amplifier stage and an output amplifier stage. The input amplifier stage is operable on a single power supply configuration. The single power supply configuration includes a power supply that develops a first potential between a first active supply terminal and a neutral terminal. The output amplifier stage is operable on a dual power supply configuration. The dual power supply configuration includes a power supply that develops a second potential between the first active supply terminal and a second active supply terminal.

In one embodiment, the input amplifier stage can have multiple amplifier stages operable on the single power supply configuration.

In one embodiment, the input amplifier stage has a first gain. In some embodiments, the input amplifier stage can have multiple stages and each stage can have a gain associated with it. The combination of the gain of each stage can be collectively referred to as the first gain, hereinafter referred as gain of the input amplifier stage.

In one embodiment, the output amplifier stage has a second gain, hereinafter referred to as the gain of the output amplifier stage. The gain of the output amplifier stage is lesser when compared to the gain of the input amplifier stage, for example, the gain of the output amplifier stage can be 10 and the gain of the input amplifier stage can be 100. The gain of the output amplifier stage is made lesser to the gain of the input amplifier stage in order to reduce the noise in the multi-stage amplifier 110. The gain of the output amplifier stage, the gain of the input amplifier stage, and a gain of a feedback network constitute loop gain of the multi-stage amplifier 110.

The multi-stage amplifier 110 is coupled to a load 120. An example of the load 120 includes but is not limited to a speaker. A combination of the multi-stage amplifier 110 and the load 120 is used to generate an audible output. In accordance with an example embodiment the multi-stage amplifier 110 is a headphone amplifier. The headphone amplifier can be included in different devices. Examples of the devices include, but are not limited to, mobile phones, laptops and computing devices. The multi-stage amplifier 110 is further explained in detail in conjunction with FIG. 2 and FIG. 3.

Figure 2:
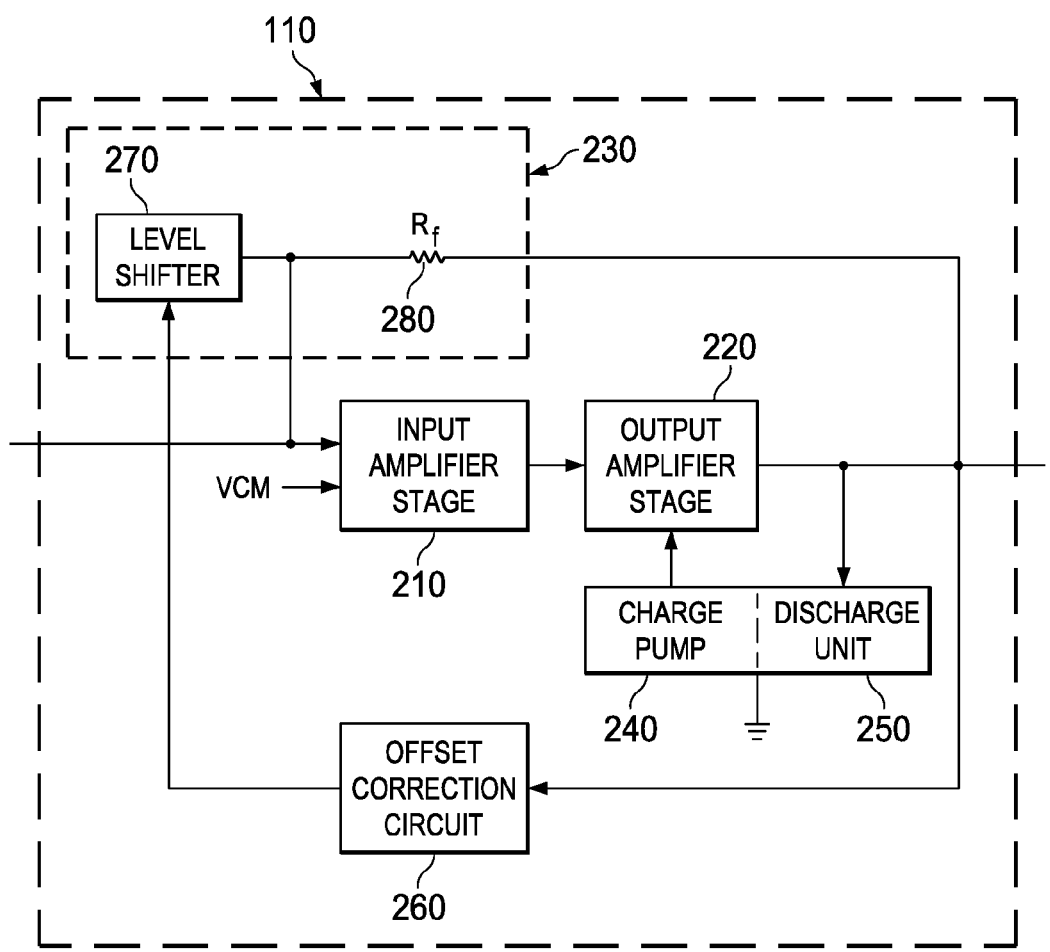
FIG. 2 is a block diagram of a multi-stage amplifier, in accordance with one embodiment.

Referring to FIG. 2 now, a multi-stage amplifier 110 includes an input amplifier stage 210 having a first input terminal and a second input terminal. The multi-stage amplifier 110 includes an output amplifier stage 220 coupled to an output of the input amplifier stage 210. Further, the multi-stage amplifier 110 includes a feedback network coupled between the first input terminal and the output of the output amplifier stage 220. The multi-stage amplifier 110 includes a level shifting unit 230 coupled to the first input terminal and the feedback network. In one embodiment, the feedback network includes a feedback resistor 280. The level shifting unit 230 includes a level shifter 270 coupled to a resistor.

The multi-stage amplifier 110 also includes a charge pump 240 coupled to the output amplifier stage 220. The multi-stage amplifier 110 includes a discharge unit 250 coupled to the charge pump 240. Further, the multi-stage amplifier 110 includes an offset correction circuit 260 coupled to the output amplifier stage 220.

The first input terminal of the input amplifier stage 210 receives an input signal from a signal source, for example, a microphone. The second input terminal receives a constant DC voltage. In one embodiment, the constant DC voltage can be an input common mode voltage (VCM). In one example, the input common mode voltage can be a voltage between the second input terminal and a reference ground potential. The input amplifier stage 210 is operable from a power supply that develops a first potential between a first active supply terminal and a neutral terminal. The output amplifier stage 220 is operable from a power supply that develops a second potential between the first active supply terminal and a second active supply terminal and to provide an output signal.

In one embodiment, the power supply can provide a DC power of approximately 1.8 volts, and the charge pump and the power supply together can provide DC power of approximately 3.6 volts to the output amplifier stage 220.

In other embodiments, the power supply can provide a DC power of approximately 1.8 volts, and the output amplifier stage 220 is operative to provide an output signal having a peak-to-peak voltage of at least 3.0 volts.

The level shifting unit 230 is responsive to a difference in magnitude between an external sense pin and the second input terminal to generate a level shifting current that enables the output amplifier stage 220 to bring down a DC value in the output signal. The charge pump 240 is operational to generate a negative supply voltage provided to the output amplifier stage 220.

The input amplifier stage 210 is associated with a first gain and the output amplifier stage 220 is associated with a second gain. The first gain and the second gain and the gain of the feedback network constitute loop gain of the multi-stage amplifier 110. The second gain is made lower as compared to the first gain. Since the charge pump 240 is coupled to the output amplifier stage 220 and not to the input amplifier stage 210, the noise associated with the negative supply voltage provided by the charge pump 240 is amplified with a lower gain. Thus, the multi-stage amplifier 110 provides a desired signal to noise ratio.

Figure 3:
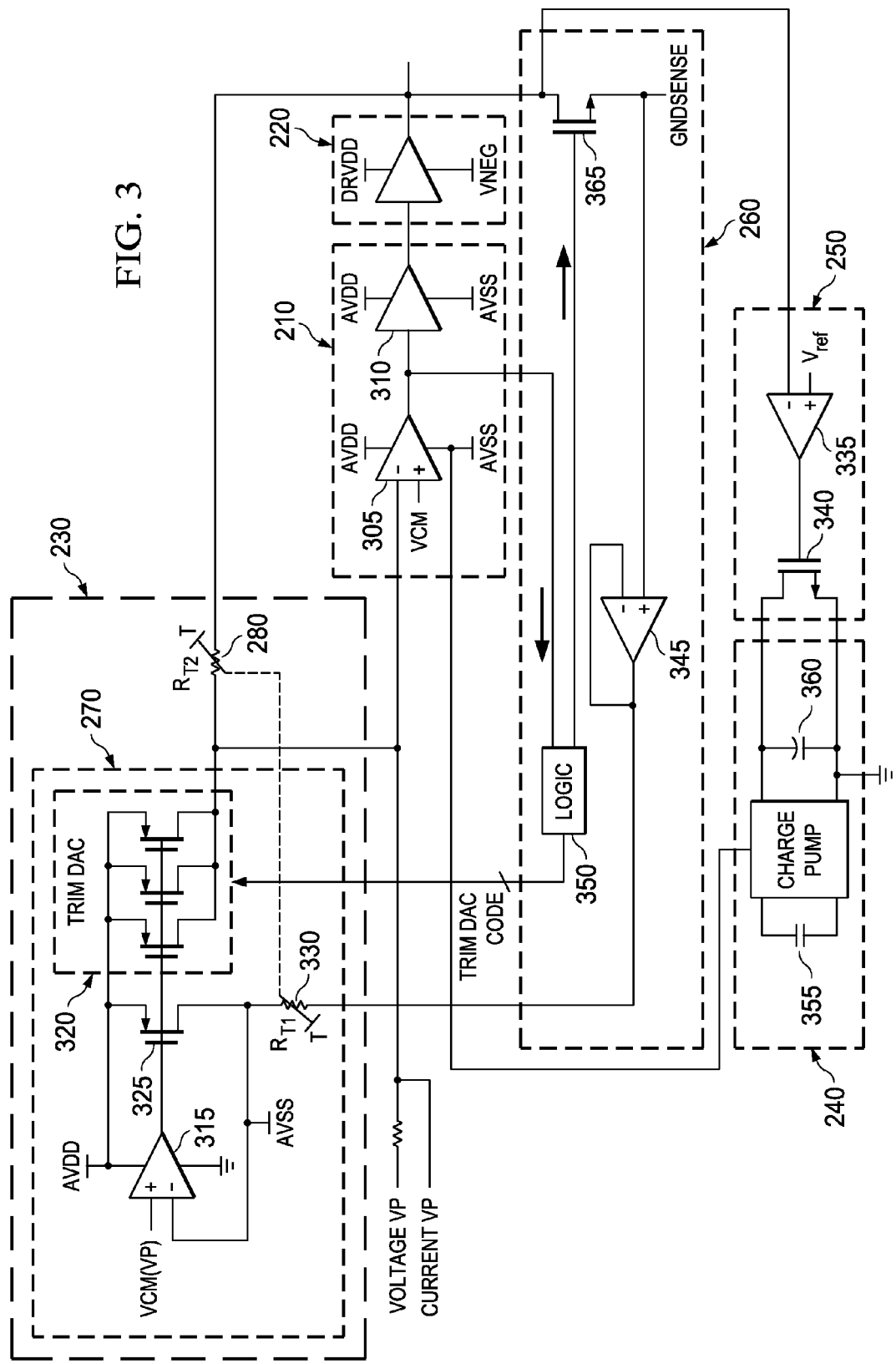
FIG. 3 is a schematic diagram of a multi-stage amplifier, in accordance with one embodiment.

Referring to FIG. 3 now, a multi-stage amplifier 110 includes an input amplifier stage 210.

In one embodiment, the input amplifier stage 210 can have multiple amplifier stages for example, a stage 305 and a stage 310, operable on a single power supply configuration. Each stage can have a gain associated with it. The combination of the gain of each stage can be collectively referred to as the first gain, hereinafter referred as gain of the input amplifier stage 210.

The multi-stage amplifier 110 includes an output amplifier stage 220 coupled to an output of the input amplifier stage 210. The output amplifier stage 220 has a second gain, hereinafter referred to as the second gain. Further, the multi-stage amplifier 110 includes a feedback network coupled between the first input terminal and the output of the output amplifier stage 220. In one embodiment, the feedback network includes the offset correction circuit 260. In other embodiments, the feedback network includes the level shifting unit 230 and the offset correction circuit 260.

The multi-stage amplifier 110 includes a level shifting unit 230 coupled to the first input terminal and the feedback network. The level shifting unit 230 includes a level shifter 270 coupled to a feedback resistor 280. The level shifter 270 includes a comparator 315 and a digital-to-analog converter (DAC) 320. In one example, the DAC can be a trim DAC. The trim DAC can include a combination of metal oxide semiconductor transistors. The level shifter 270 also includes a metal oxide semiconductor transistor 325 and a resistor 330. The level shifter 270 is operational to shift a level of output signal of the output amplifier stage 220.

The multi-stage amplifier 110 also includes a charge pump 240 coupled to the output amplifier stage 220. The charge pump 240 includes a capacitor 355 and a capacitor 360.

The capacitors (the capacitor 355 and the capacitor 360) are coupled in parallel combination. The positive plate of the capacitor 360 is electrically connected to a neutral potential. The charge pump works in synchronism with a clock (not shown in figure). The charging of at least one of the capacitors (the capacitor 355 or the capacitor 360) result in generation of a negative supply voltage.

The multi-stage amplifier 110 includes a discharge unit 250 coupled to the charge pump 240. The discharge unit 250 includes a comparator 335 and a transistor 340 coupled to the comparator 335 for causing a discharge after sensing a signal swing saturation phenomenon.

Further, the multi-stage amplifier 110 includes an offset correction circuit 260 coupled to the output amplifier stage 220. The offset correction circuit 260 includes a buffer 345 that is coupled to a digital logic 350 that generates a digital code corresponding to an offset. The offset correction circuit 260 also includes a metal oxide semiconductor transistor 365. The offset can be due to mismatch in the resistances (the resistance 330 and the resistance 280). In one example, the offset can be due to offset of the multi-stage amplifier 110.

Figure 4:
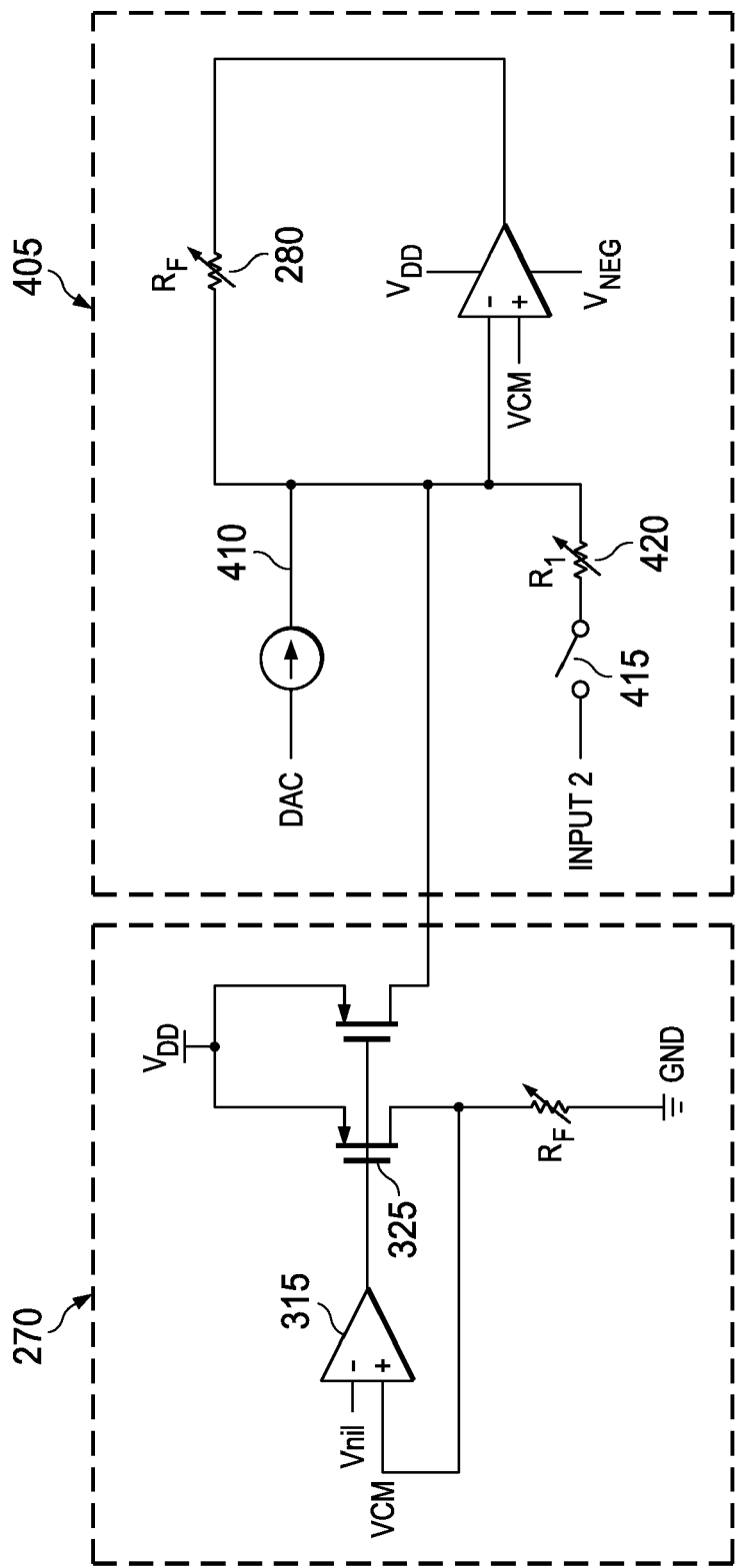
FIG. 4 is a schematic diagram of a multi-stage amplifier, in accordance with another embodiment.

Referring to FIG. 4 now, a circuit 405 includes a feedback resistor 280. A DAC output 410 is coupled to a first input terminal of the circuit 405. In one embodiment, the first input terminal of the circuit 405 receives an input signal through a combination of a switch 415 and a potentiometer 420.

In various applications, an amplifier may need to accept input signals arising from different sources. Typically, based on the sources, the input signals can be a signal that can be quantified with a voltage magnitude or a current magnitude.

In one example, the DAC output 410 can be a current having zero magnitude. The input signal through the combination of the switch 415 and the potentiometer 420 can be a signal having a magnitude equal to V volts. Since the current magnitude is zero, the amplifier outputs a signal having a magnitude equal to the sum of the input signal magnitude and a DC voltage due to common mode configuration. The signal magnitude can be represented in the equation given below.

Signal magnitude at the output of the amplifier=$(V \times (R_F/R_1))$+DC voltage due to common mode configuration, where V is the voltage, $R_F$ is the feedback resistance, and $R_1$ is a resistance of the potentiometer 420.

In another example, the DAC output 410 can be a current having a non-zero magnitude. The input signal through the combination of the switch 415 and the potentiometer 420 can be a voltage having zero magnitude. Since the voltage magnitude is zero, the amplifier outputs a signal having a magnitude equal to the sum of a signal magnitude from the DAC output 410 and a DC voltage due to common mode configuration. The signal magnitude at the output of the amplifier can be represented in the equation given below.

Signal magnitude at the output of the amplifier=$(I^*R_F)$+DC voltage due to the common mode configuration, where I is the current having non-zero magnitude.

In order to bring down a DC value of the signal magnitude at the output of the amplifier, a current is pumped using a level shifter 270 into the feedback resistor 280. The level shifter 270 receives an input voltage $V_{ni1}$ at one terminal and a common mode voltage (VCM) at another terminal. The input voltage $V_{ni1}$ is input at a non-inverting (−) terminal of a comparator 315 of the level shifter 270. In one embodiment, the DC value can be of a magnitude having a minor deviation from the neutral potential. An output of the comparator 315 is coupled to the plurality of gate coupled transistors, for example a transistor 325 causing the generation of direct current for passing through the feedback resistor 280 to thereby have a zero DC value at the output of the amplifier.

Figure 5:
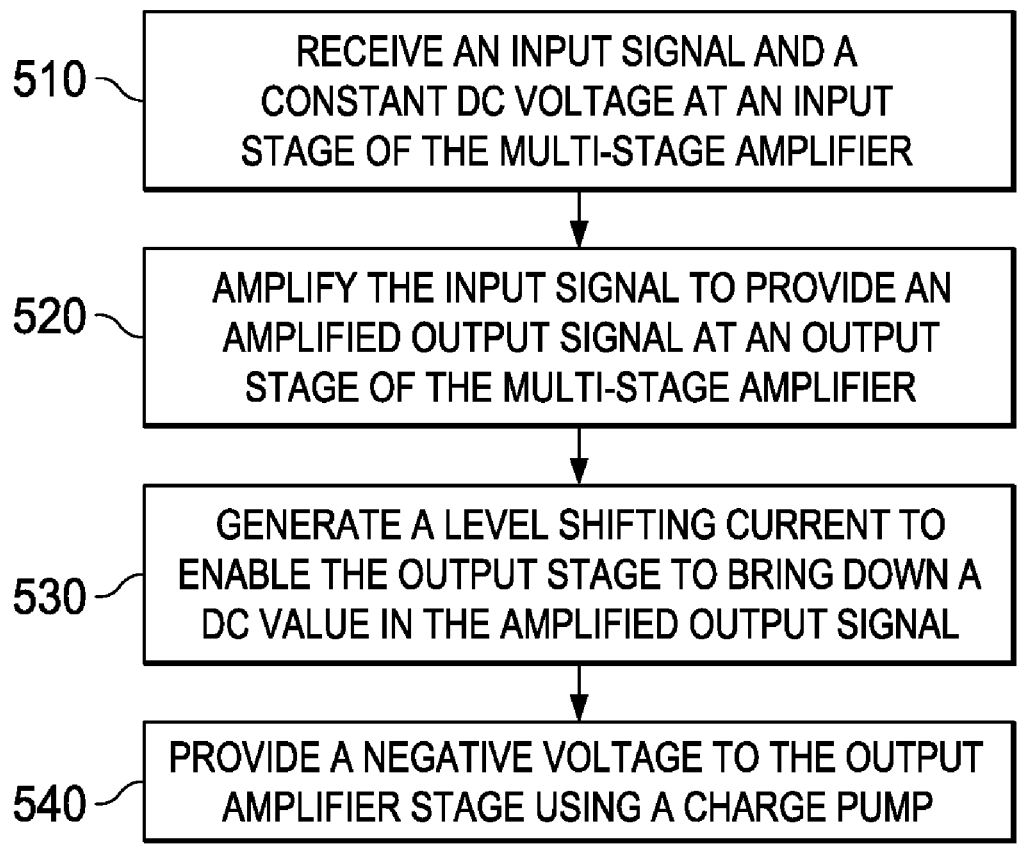
FIG. 5 is a flow chart illustrating a method of amplifying a signal in a multi-stage amplifier, in accordance with one embodiment.

FIG. 5 is a flow diagram illustrating a method of amplifying a signal in a multi-stage amplifier.

At step 510, an input signal and a constant DC voltage is received at an input stage of the multi-stage amplifier.

The multi-stage amplifier receives the input signal at one of its terminals from a signal source, for example, a microphone. The multi-stage amplifier receives the constant DC voltage at another terminal. In one embodiment, the constant DC voltage can be an input common mode voltage (VCM). In one example, the input common mode voltage can be a voltage between the second input terminal and a reference ground potential.

At step 520, the input signal is amplified to provide an amplified output signal at an output stage of the multi-stage amplifier.

In one embodiment, the multi-stage amplifier includes an input amplifier stage and an output amplifier stage. The input amplifier stage is operable on a single power supply configuration. The single power supply configuration includes a power supply that develops a first potential between a first active supply terminal and a neutral terminal. The output amplifier stage is operable on a dual power supply configuration. The dual power supply configuration includes a power supply that develops a second potential between the first active supply terminal and a second active supply terminal. The input signal is amplified by the gain of the input amplifier stage and the output amplifier stage.

At step 530, a level shifting current is generated to enable the output stage to bring down a DC value in the amplified output signal. The generation of the level shifting current includes pumping a direct current through a feedback resistor of the multi-stage amplifier. Further, the pumping of the direct current comprises pumping the direct current in synchronization with a signal applied to an external sense pin, an internal common voltage, and a signal across the feedback resistor of the multi-stage amplifier. An output common voltage and a voltage at the external sense pin are equal in magnitude, wherein the output common voltage is independent of a gain setting parameter of the multi-stage amplifier. Further, a ground loop noise effect is cancelled in the multi-stage amplifier is response to the synchronization. The level shifting current brings down the DC value of the amplified output signal to a neutral potential. In one embodiment, the DC value can be of a magnitude having a minor deviation from the neutral potential. The multi-stage amplifier is also protected from a power supply voltage that exceeds a maximum power supply voltage parameter of the multi-stage amplifier by biasing an output transistor of the amplifier in a reliability zone.

At step 540, a negative voltage is provided to the output amplifier stage using a charge pump.

The charge pump is coupled to the output amplifier stage and not to the input amplifier stage. The output amplifier stage has a lower gain as compared to the gain of the input amplifier stage. Hence, the noise associated with the negative supply voltage provided by the charge pump is amplified with a lower gain. Thus the amplified output signal can have a desired signal to noise ratio.

Figure 6:
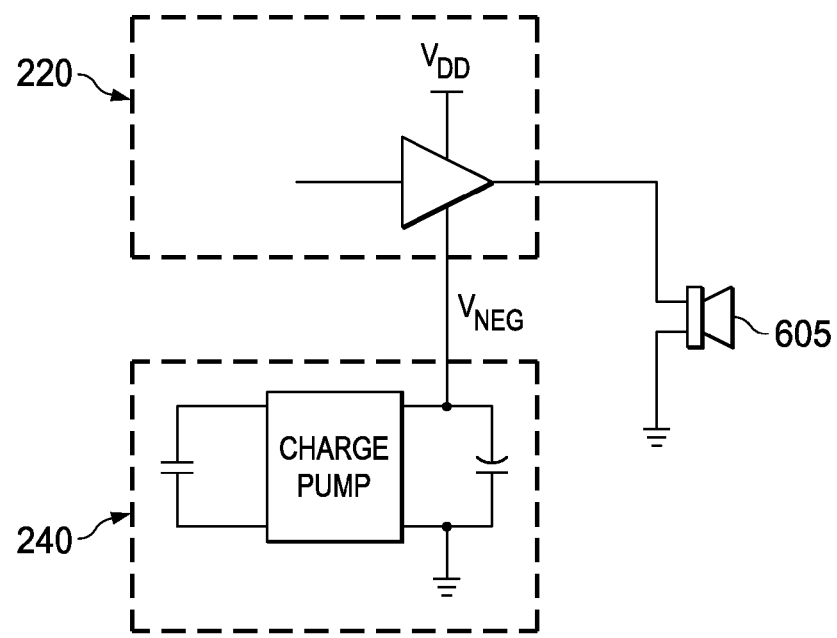
FIG. 6 is an exemplary illustration of a portion of a multi-stage amplifier, in accordance with one embodiment.

Referring to FIG. 6, a charge pump 240 is coupled to an output amplifier stage 220 and a load 605. The load 605 can be configured for 16 ohms and 40 milliwatts output power. The charge pump 240 includes one or more capacitors. The charge pump 240 uses the capacitors as energy storage elements to generate one of a positive or a negative voltage. In one embodiment, the charge pump 240 provides a negative voltage to the output amplifier stage 220. Further, since the output amplifier stage 220 has a lower gain, the noise associated with the negative voltage is reduced at the output of output amplifier stage 220.

Figure 7:
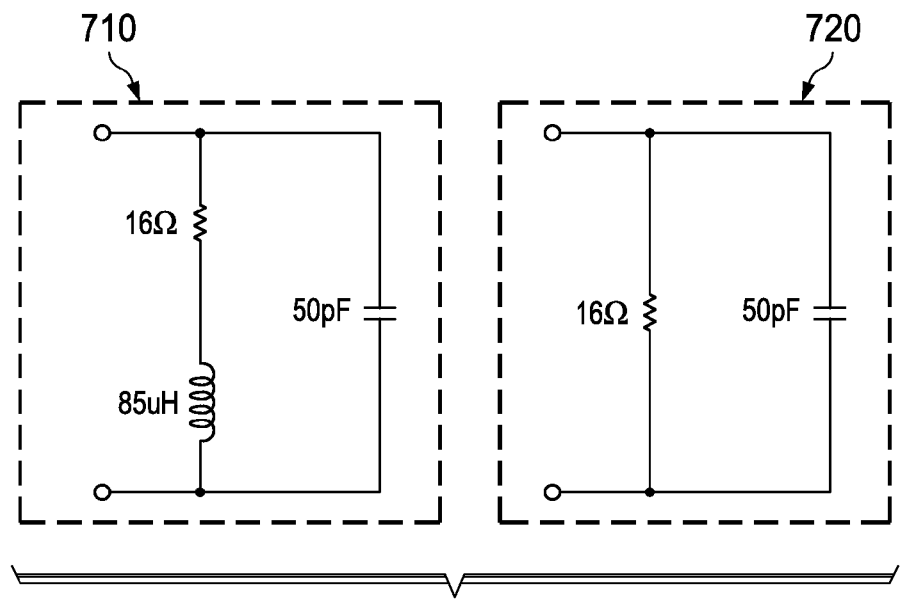
FIG. 7 is a partial schematic drawing illustrating modeling a plurality of loads of a headphone.

Referring to FIG. 7, a first load 710 may include a series combination of a resistor and an inductor, wherein the series combination is coupled in parallel to a capacitor, for example. A second load 720 may include a parallel combination of a resistor and capacitor.

In accordance with an example embodiment, a headphone amplifier can be integrated with a core of an Integrated Circuit. Advantages of the headphone amplifier include, but not limited to, the following. The headphone amplifier does not use an external capacitor for signal coupling and dual supply for the entire amplifier device. A double signal swing is obtained from a single power supply. Enhanced power efficiency is obtained at the output of the headphone amplifier. Lower coupling from charge pump ripple is obtained. The headphone amplifier has a low dc offset and has a low area. Noise in the audible output of the headphone amplifier is minimal for a user listening to music through the headphone. A −1.95 volts charge pump output is a reliability concern for 3.3 volts output stage devices, where maximum voltage limit is 3.6 volts, in accordance with an example. The reliability concern is taken care of in the headphone amplifier by using a discharge circuit in the headphone amplifier as and when the output signal starts saturating and the output transistor goes out of the reliability zone.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. An amplifier comprising:
   an input amplifier stage having a first input terminal and a second input terminal and having a first gain, the first input terminal receiving an input signal, the second input terminal receiving a constant DC voltage, the input amplifier stage operable from a power supply that develops a first potential between a first active supply terminal and a neutral terminal;
   an output amplifier stage coupled to an output of the input amplifier stage and having a second gain, the output amplifier stage operable from a power supply that develops a second potential between the first active supply terminal and a second active supply terminal and to provide an output signal;
   a feedback network coupled between the first input terminal and an output of the output amplifier stage;
   a level shifting unit coupled to the first input terminal and the feedback network, the level shifting unit responsive to a difference in magnitude between an external sense pin and the second input terminal and generate a level shifting current that enables the output amplifier stage to bring down a DC value in the output signal; and
   a charge pump coupled to the output amplifier stage, the charge pump operational to generate a negative supply voltage provided to the output amplifier stage and to minimize a noise associated with the negative supply voltage using a loop gain of the amplifier, wherein the loop gain is a combination of the first gain, the second gain, and a gain of the feedback network.

2. The amplifier of claim 1, wherein the apparatus further comprises a discharge unit that is coupled between the charge pump and the output amplifier stage and that is operational to minimize voltage across the output amplifier stage when signal swing saturation occurs at supply voltages greater than reliability limit responsive to an operation of the charge pump.

3. The amplifier of claim 1, wherein the feedback network and the level shifting unit enables: an input common mode configuration of the amplifier; and an output common mode configuration of the amplifier to be different.

4. The amplifier of claim 1, wherein the level shifting unit comprises a level shifter; and a resistor.

5. The amplifier of claim 4, wherein the level shifter comprises: a comparator having an input terminal and an output terminal; and a trim digital-to-analog converter coupled to the output terminal, the level shifter operational to shift a level of the output signal.

6. The amplifier of claim 1, wherein the apparatus further comprises an offset correction circuit, the offset correction circuit comprising a buffer coupled to a digital module that generates a digital code corresponding to an offset.

7. The amplifier of claim 2, wherein the discharge unit comprises:
   a comparator; and
   a transistor coupled to the one or more comparators for causing a discharge after sensing a signal swing saturation phenomenon.

8. A method for amplifying a signal in a multi-stage amplifier, the method comprising:
   receiving an input signal and a constant DC voltage at an input stage of the multi-stage amplifier;
   amplifying the input signal to provide an amplified output signal at an output stage of the multi-stage amplifier;
   generating a level shifting current to enable the output stage to bring down a DC value in the amplified output signal; and
   providing a negative voltage to the output stage using a charge pump.

9. The method of claim 8, wherein generating the level shifting current comprises pumping a direct current through a feedback resistor of the multi-stage amplifier.

10. The method of claim 9, wherein the pumping of the direct current comprises pumping the direct current in synchronization with: a signal applied to an external sense pin; an internal common voltage; and a signal across the feedback resistor of the multi-stage amplifier.

11. The method of claim 10, wherein an output common voltage and a voltage at the external sense pin are equal in magnitude, wherein the output common voltage is independent of a gain setting parameter of the multi-stage amplifier.

12. The method of claim 10, wherein a ground loop noise effect is cancelled in the multi-stage amplifier responsive to the synchronization.

13. The method of claim 8, wherein the method further comprises protecting the multi-stage amplifier from a power supply voltage that exceeds a maximum power supply voltage parameter of the multi-stage amplifier.

14. The method of claim 13, wherein protecting the multi-stage amplifier comprises biasing an output transistor of the multi-stage amplifier in a reliability zone.

15. The method of claim 14, further comprising reducing an output direct current offset of the multi-stage amplifier.

16. An amplification system comprising:
    an input amplifier stage having a first input terminal and a second input terminal and having a first gain, the first input terminal receiving an input signal, the second input terminal receiving a constant DC voltage, the input amplifier stage operable from a power supply that develops a first potential between a first active supply terminal and a neutral terminal;
    an output amplifier stage coupled to an output of the input amplifier stage and having a second gain, the output amplifier stage operable from a power supply that develops a second potential between the first active supply terminal and a second active supply terminal and to provide an output signal;
    a feedback network coupled between the first input terminal and an output of the output amplifier stage;
    a level shifting unit coupled to the first input terminal and the feedback network, the level shifting unit responsive to a difference in magnitude between an external sense pin and the second input terminal and generate a level shifting current that enables the output amplifier stage to bring down a DC value in the output signal;
    a charge pump coupled to the output amplifier stage, the charge pump operational to generate a negative supply voltage provided to the output amplifier stage and to minimize a noise associated with the negative supply voltage using a loop gain of the amplification system, wherein the loop gain is a combination of the first gain and the second gain and a gain of the feedback network;
    a discharge unit coupled to the charge pump and operational to minimize voltage across the output amplifier stage when signal swing saturation occurs at supply voltages greater than reliability limit responsive to an operation of the charge pump; and
    an offset correction circuit coupled to the output amplifier stage, the offset correction circuit comprising a buffer coupled to a digital module that generates a digital code corresponding to an offset and to correct the offset in the output signal.

17. The amplification system of claim 16 and further comprising a power supply that provides DC power of approximately 1.8 volts, and wherein the charge pump and the power supply together provide DC power of approximately 3.6 volts to the output amplifier stage.

18. The amplification system of claim 16 and further comprising a power supply that provides DC power of approximately 1.8 volts, and wherein the output amplifier stage is operative to provide an output signal having a peak-to-peak voltage of at least 3.0 volts.

\* \* \* \* \*